United States Patent

Wilson

[15] 3,638,136

[45] Jan. 25, 1972

[54] METHOD OF AND APPARATUS FOR CONTROLLING OSCILLATOR EFFICIENCY

[72] Inventor: Thomas L. Wilson, Louisville, Ky.

[73] Assignee: Chemetron Corporation, Chicago, Ill.

[22] Filed: May 1, 1970

[21] Appl. No.: 33,801

[52] U.S. Cl. .............................331/74, 219/10.75, 331/169, 331/183

[51] Int. Cl. ........................................H03b 3/14, H03b 5/10

[58] Field of Search ........331/74, 109, 117 R, 167, 169–171, 331/182, 183; 219/10.75, 10.77

[56] References Cited

UNITED STATES PATENTS 2,305,262 12/1942 Lange ..................................331/169

2,446,032 7/1948 Watts et al. .....................219/10.75 X

*Primary Examiner*—John Kominski

*Assistant Examiner*—Siegfried H. Grimm

*Attorney*—Mason, Kolehmainen, Rathburn & Wyss

[57] ABSTRACT

The efficiency of a high-frequency power source is maximized by proper selection of the power oscillator tube filament bypass capacitor. By selecting the proper value for this bypass capacitor, reactive components of the oscillator tube plate current are eliminated and the oscillator tube plate dissipation is minimized. The value of this capacitor can be varied over a fairly wide range without producing any significant percentage change in the frequency at which the power source operates.

8 Claims, 4 Drawing Figures

PATENTED JAN 25 1972 3,638,136

INVENTOR:
THOMAS L. WILSON
BY Mason, Kolehmainen Rathburn & Wyss
ATTORNEYS

METHOD OF AND APPARATUS FOR CONTROLLING OSCILLATOR EFFICIENCY

The present invention relates to high power, high-frequency oscillators, for example oscillators suitable for use in dielectric heating systems and the like. In the design of high-power, high-frequency oscillators, a primary objective is to maximize the oscillator high-frequency output while simultaneously minimizing heating within the oscillator itself. The efficiency of a power oscillator is defined at the ratio of the high-frequency energy which reaches some external load to the total direct current and low-frequency energy drawn from external power supplies. The higher the efficiency of an oscillator, the more power it can put out without overheating.

In the past, high-frequency vacuum tube power oscillators have been designed in much the same way that nonpower vacuum tube oscillators are designed. More particularly, it has been customary to connect the oscillator tube filaments directly to ground by means of a low reactance circuit. Traditionally the filaments are connected to ground by a bypass capacitor having a large capacitance value to minimize the high-frequency potential difference between the filaments and ground. It has always been thought that this practice would maximize the energy that is supplied to the external load. This arrangement is also desirable in that it protects the tube filament power supply from receiving too much high-frequency power.

A primary object of the present invention is to increase the efficiency of a high-frequency power oscillator so that higher power outputs can be obtained from the oscillator.

Another object of the present invention is to find a way of optimizing the efficiency of a high-frequency power oscillator without altering the oscillator frequency of oscillation by more than s small percentage value.

The present invention is a method for optimizing the efficiency of a high-frequency power oscillator and an oscillator that can be optimized in accordance with the method. The present invention requires that a carefully chosen value of capacitive reactance be used to couple the oscillator filaments or cathode to ground. By choosing the proper value of capacitive reactance, the efficiency of the oscillator can be increased by as much as 45 percent. The proper value of filament-to-ground capacity causes the oscillator plate voltage and current to fluctuate in phase with one another. Out-of-phase or reactive plate current components cannot transfer energy to the material between the heating electrodes, but these components can and do increase plate dissipation and losses within the heating unit. The present invention increases the efficiency of the heating unit by minimizing the reactive components of the oscillator plate current. The filament-to-ground capacitor capacitance value is first chosen such that the voltage between the filaments and ground lags the filament current by 90° and is further adjusted to put the voltage at the plate of the oscillator tube into phase with the plate current or out of phase with the grid voltage. More practically, direct measurements of the oscillator efficiency are made, and the capacitance value which maximizes the oscillator efficiency is chosen.

The same technique can be used to optimize the efficiency of solid-state power oscillators, for example transistorized power oscillators or controlled rectifier power oscillators. In such an oscillator, the transistor emitter or the controlled rectifier cathode is traditionally either coupled directly to ground or is grounded through a large bypass capacitor. The insertion of the proper value of capacitive reactance at this point can optimize the efficiency of such an oscillator just as it can optimize the efficiency of a vacuum tube power oscillator.

Further objects and advantages of the present invention will become apparent in the detailed description which follows, and the features of novelty which characterize the present invention will be pointed out with particularity in the claims annexed to and forming a part of this specification.

The invention will best be understood through consideration of the following detailed description in connection with the drawings, wherein.

Figure 1:
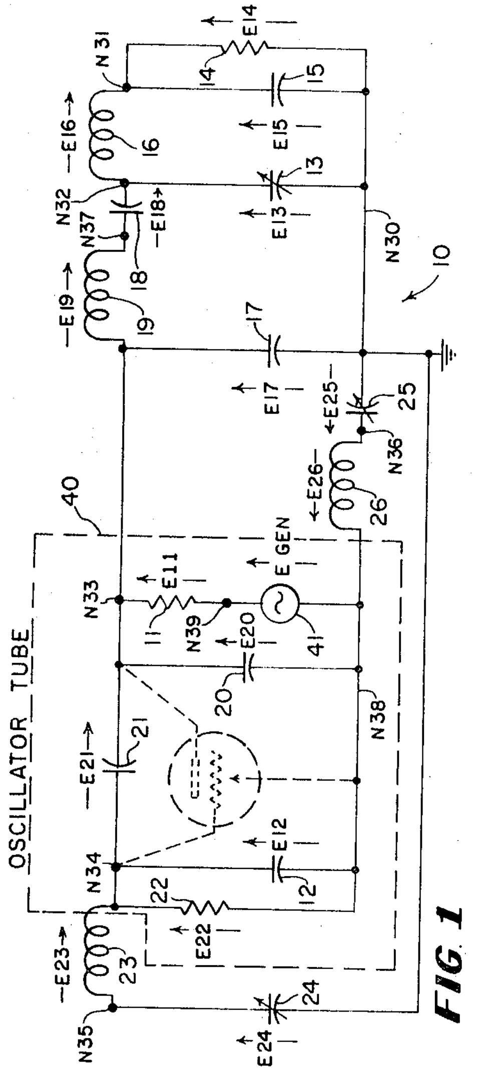
FIG. 1 is a schematic diagram of a dielectric heating system designed in accordance with the present invention.
Figure 4:
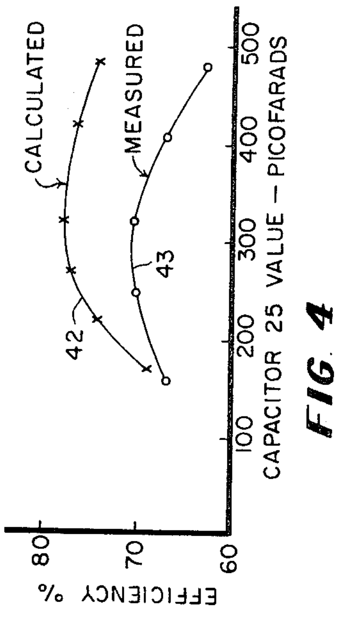
Figure 3:
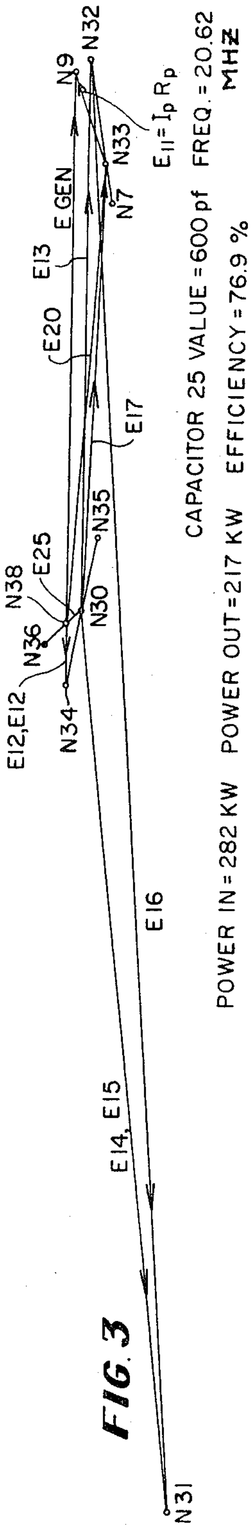

FIG. 3 is a vector diagram showing the amplitude and phase relationships between voltages indicated in FIG. 1 when the dielectric heating system is close to full optimization; and FIG. 4 is plot of efficiency versus the capacitance value of the filament-to-ground coupling capacitor for the idealized dielectric heating system shown in FIG. 1 and for an actual dielectric heating system having similar component values.

Referring now to FIG. 1 of the drawings, there is shown a schematic representation of a dielectric heating system including a power oscillator and indicated generally by the reference numeral 10. The schematic diagram of FIG. 1 is a high-frequency representation of the system 10. Circuits for providing input power to the plate of a power oscillator tube 40 and for providing heater or filament current to the filaments of the oscillator tube 40 are not shown since such circuits are not relevant to the present invention. The oscillator tube 40 is shown represented by elements 11, 12, 20, 21, 22, and 41. By choosing appropriate values for these elements, a very good high-frequency representation of a triode oscillator tube can be had. NODES N 38, N 34, and N 33 are respectively the filament, grid, and plate connections of the oscillator tube 40. Capacitors 12, 21, and 20 respectively represent the filament-to-grid capacity, the grid-to plate capacity, and the filament-to-plate capacity of the oscillator tube 40. A resistor 22 represents the power absorbed by the grid of the oscillator tube 40. A voltage generator 41 and a resistor 11 are connected in series between the filament node N 38 and the plate node N 33 to represent the equivalent plate resistance and the equivalent internal plate voltage of the oscillator tube 40. A voltage E GEN appears across the generator 41 and is proportional to the grid-to-filament voltage of the tube 40 multiplied by the voltage gain of the oscillator tube 40.

A capacitor 15 represents the capacity between the heating electrodes of the dielectric heating system 10. An equivalent resistor 14 is connected in parallel with this capacitor 15 between the nodes N 30 and N 31 to represent the energy loss due to heating of the dielectric load positioned between the heating electrodes. The node N 30 is defined to be at ground potential. The node N 31 is connected to a node N 32 by a resonating inductor 16, and the node N 32 is connected to the ground potential node N 30 by a variable capacitor 13. Elements 13, 15, and 16 form the resonant tank circuit of the dielectric heating system 10 and determine resonant frequency of the system 10. The variable capacitor 13 is generally motor driven and is adjusted to control the amount of energy which reaches the dielectric load 14.

The node N 32 is connected to the oscillator tube plate node N 33 by a coupling capacitor 18. The capacitor 18 prevents the potentially lethal DC plate voltage of the oscillator tube 40 from reaching the heating electrodes. An inductor 19 is shown in series with the coupling capacitor 18. This inductor 19 represents the inductance of the coupling connection which, though small, is too large to be neglected. A capacitor 17, which connects the plate node N 33 to the ground potential node N 30, represents the stray capacity between the tube anode and its water jacket (not shown). A coupling capacitor 18 controls the value which maximizes the voltage across the resonant tank circuit (elements 13, 15, and 16). Feedback from the plate to the grid of the oscillator tube 40 is provided by the internal plate-to-grid capacitance 21 of the oscillator tube 40. The magnitude of the signal at the grid node N 34 is adjusted by means of a tuned circuit comprising an inductor 23 and a variable capacitor 24 connected serially between the grid node N 34 and the ground potential node N 30. The reactance between the grid and ground is inductive and is generally so small that the inductance 23 cannot be made variable without the presence of the variable capacitor 24. The capacitor 24 does not pass direct currents, and hence a grid bias potential can be applied directly to either the node N 35 or to the grid node N 34 through a suitable high impedance resistor or radio frequency choke.

The reactance of the lead connecting the ground potential node N 30 to the filament node N 38 of the oscillator tube 40 comprises the net reactance of a filament bypass capacitor 25 connected in series with the stray inductance of the lead. This stray inductance is represented in FIG. 1 by an inductor 26. In accordance with the teachings of the present invention, the capacitor 25 is given a value which makes the net reactance of this lead capacitive. The capacity of the capacitor 25 is not chosen to minimize the reactance between the tube 40 filament and ground, but to maximize the operating efficiency of the dielectric heating system 10 by minimizing the phase difference between the oscillator tube 40 plate voltage and the oscillator tube 40 plate current.

Figure 2:
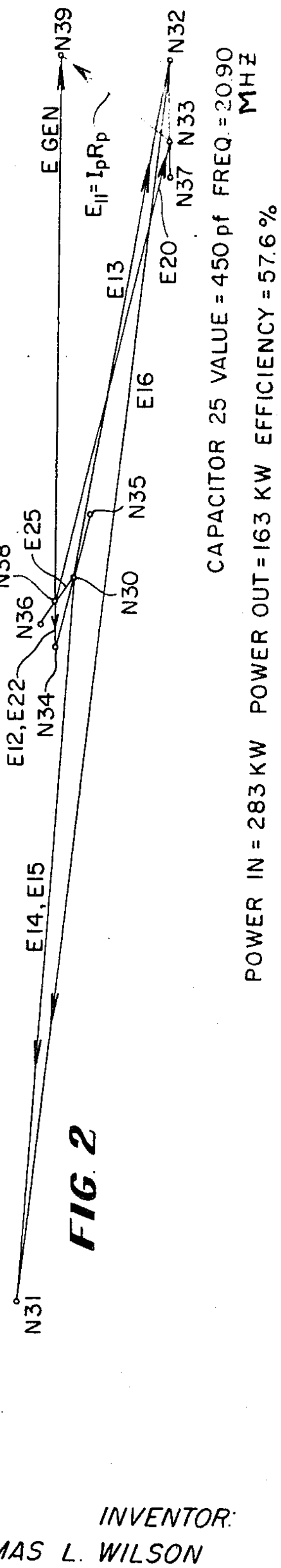
FIG. 2 is a vector diagram showing the amplitude and phase relationships between voltages indicated in FIG. 1 before the dielectric heating system has been optimized.

To illustrate how the capacitor 25 is able to control the efficiency of the system 10, a computer analysis of the circuit shown in FIG. 1 has been carried out. The result of this analysis is shown in FIGS. 2 and 3 as vector diagrams. The various voltages indicated in FIG. 1 are represented in the vector diagrams by vectors which are assumed to rotate in a counterclockwise direction at the frequency of oscillation of the system 10. FIGS. 2 and 3 both represent the position of these vectors at one particular instant in time. The length represents the magnitude of the corresponding voltage shown in FIG. 1 at that particular time. A more detailed explanation of vectors and their use can be found on pages 194 to 197 of the book entitled "NETWORK ANALYSIS" by M. E. Van Valkenburg, published by Prentice-Hall, Inc., Englewood Cliffs, N.J. (1955).

The only element of FIG. 1 that is different in FIG. 3 than it is in FIG. 2 is the capacitance value of the filament-to-ground coupling capacitor 25. In FIG. 2 the capacitor 25 has a capacitance value of 460 picofarads, and in FIG. 3 the capacitor 25 has a capacitance value of 600 picofarads. The important difference between the two vector plots is the change in the length of the vector labeled E 11 which represents the voltage drop across the internal plate resistor 11 of the oscillator tube 40. The vector E 11 in FIG. 2 is at least one third longer than this same vector is in FIG. 3. The length of the vector E 11 is proportional to the plate current in the oscillator tube 40. Since heat losses within the oscillator tube 40 are proportional to plate current, the length of the vector E 11 is also proportional to the heat losses within the oscillator tube 40. FIGS. 2 and 3 show clearly that an alteration in the filament bypass capacitor 25 has a significant effect upon the length of the vector E 11 and therefore upon the efficiency of the heating system 10. In this particular example, assuming that the power input to the heating system 10 is maintained constant, the computer analysis indicated that the output power dissipated in the dielectric load (represented by the equivalent resistor 14 in FIG. 1) is increased from 163,000 watts to 217,000 watts when the size of the capacitor 25 is altered by 25 percent. This is a 33 percent increase in the power delivered to the dielectric load and represents an increase in efficiency of almost 10 percent. The frequency shift caused by this change in capacity is less than 2 percent and is negligible in this particular application.

FIG. 4 is a plot of efficiency versus the value of the capacitor 25 for a commercial dielectric heating system which is similar to the system 10 shown in FIG. 1. The calculated curve 42 results from a computer analysis similar to that which gave rise to the vector diagrams shown in FIGS. 2 and 3. The measured curve 43 resulted from actual measurements taken on the commercial dielectric heating system. The calculated curve 42 gives a higher overall efficiency than does the measured curve 43. This is to be expected, since the computer model only approximates the actual system. Many losses, such as losses in inductive and capacitive elements, were neglected. In addition, many capacities and inductances could not be measured at 18 megacycles, and the values of these elements had to be estimated. Direct measurement of efficiency can only be accomplished with the help of five indicating instruments each of which introduces some error into the measurement. The close shape correspondence between the two curves is a striking practical confirmation of the theory behind the present invention. By reducing the capacity 25 from a value of 480 picofarads to a value of 320 picofarads, the efficiency of an actual system is increased by 7½ percent. This increase in efficiency makes it possible to decrease the heating time required to obtain a desired result, and therefore results in a proportionate increase in production.

If the system 10 were designed in the conventional manner, the capacitor 25 would have a capacitance value chosen to minimize the potential between the node N 38 and the ground potential node N 30. The net reactance between the nodes N 30 and N 38 would then be close to zero, and these two nodes would be effectively at the same potential. Although this condition is often advocated in the literature, it cannot optimize the efficiency of all circuits. This is apparently because of resistive losses in the oscillator tube grid circuit which cause a voltage drop across the elements 23 and 24 that is out of phase with the voltage drop across the elements 12 and 22. Maximum efficiency then requires the ground node N 30 to be at a different potential than the node N 38. Optimum efficiency is obtained when the oscillator tube 40 plate current is in phase with the equivalent generator 41 voltage E GEN. Hence, the capacitor 25 is selected to place vector representing current flow through the equivalent plate resistor 11 into phase with the voltage generator vector E GEN. This causes the plate voltage vector E 20 and the voltage generator vector E GEN to be roughly parallel. In FIG. 2 these two voltage vectors E 20 and E GEN diverge substantially. Hence, the voltage vector E 11 across the triode equivalent plate resistor 11 is substantially longer than it is in FIG. 3. In FIG. 3, the optimum condition is still not reached, but the voltage vector E 11 is considerably shortened because the vectors E 20 and E GEN are almost parallel and colinear. Further adjustment of the capacitor 25 could bring the vectors E 20 and E GEN into still closer alignment.

Although the present invention has been described with reference to an illustrative embodiment thereof, it should be understood that numerous other modifications and changes will readily occur to those skilled in the art, and it is therefore intended by the appended claims to cover all such modifications and changes that will fall within the true spirit and scope of the invention.

What is claimed as new and desired to be secured by Letters Patent of the United States is:

1. A method of increasing the efficiency of a high-frequency power oscillator which includes an amplification device that generates an output signal including an output voltage and an output current, and further having one lead connected by an impedance to a node common to both one side of a resonant load and to a feedback network which network supplies an input signal to the amplification device, said method comprising the steps of:

adjusting the value of the impedance so that it is basically a capacitive reactance; and further adjusting the value of the impedance until the amplification device output voltage and output current are approximately in phase with one another.

2. A method of increasing efficiency in accordance with claim 1 wherein the second adjustment is carried out by directly measuring the efficiency of the power oscillator system for different values of the impedance and then adjusting the value of the impedance to that value which gives maximum efficiency.

3. A method of increasing efficiency in accordance with claim 1 wherein the second adjustment is carried out by measuring the phase error between the output voltage and the output current for different values of the impedance and then adjusting the impedance to that value which results in the minimum phase error.

4. A method of increasing efficiency in accordance with claim 1 wherein the second adjustment is carried out by measuring the phase difference between the output signal and the input signal for different values of the impedance and then adjusting the impedance to that value which results in a phase difference that is closest to 180°.

5. A method of increasing efficiency in accordance with claim 1 wherein the second adjustment is carried out by measuring the output signal magnitude for different values of the impedance with the input power held relatively constant and then adjusting the impedance to that value which results in maximum output signal magnitude.

6. A high-frequency power oscillator system including an active device which generates an output voltage and current and which device has a terminal, and a node which is common to a resonant load and to a feedback network, wherein the improvement comprises an impedance network connected between said node and said terminal having a net impedance value which is capacitive and which minimizes the phase difference between said output voltage and current.

7. A high-frequency power oscillator system including an active device which generates an output signal and which device has a terminal, and a node which is common to a resonant load and to an input signal generating feedback network, wherein the improvement comprises an impedance network connected between said node and said terminal having a net impedance value which is capacitive and which effects a phase difference between said output signal and said input signal approaching 180°.

8. A high-frequency power oscillator system including an active device which generates an output voltage and current and which device has a terminal, and a node which is common to a resonant load and to a feedback network, wherein the improvement comprises an impedance network connected between said node and said terminal having a net impedance value which is capacitive and which maximizes the efficiency of the power oscillator.

* * * * *